US009799563B2

(12) United States Patent
Hsieh et al.

(10) Patent No.: US 9,799,563 B2
(45) Date of Patent: Oct. 24, 2017

(54) FAN-OUT WAFER LEVEL CHIP PACKAGE STRUCTURE AND MANUFACTURING METHOD THEREOF

(71) Applicants: NIKO SEMICONDUCTOR CO., LTD., New Taipei (TW); SUPER GROUP SEMICONDUCTOR CO., LTD., New Taipei (TW)

(72) Inventors: Chih-Cheng Hsieh, Taoyuan (TW); Hsiu-Wen Hsu, Hsinchu County (TW)

(73) Assignees: NIKO SEMICONDUCTOR CO., LTD., New Taipei (TW); SUPER GROUP SEMICONDUCTOR CO., LTD., New Taipei (TW)

( * ) Notice: Subject to any disclaimer, the term of this patent is extended or adjusted under 35 U.S.C. 154(b) by 0 days.

(21) Appl. No.: 14/791,310

(22) Filed: Jul. 3, 2015

(65) Prior Publication Data

US 2016/0126228 A1 May 5, 2016

(30) Foreign Application Priority Data

Oct. 31, 2014 (TW) .............................. 103137864 A

(51) Int. Cl.
*H01L 23/495* (2006.01)
*H01L 21/78* (2006.01)
(Continued)

(52) U.S. Cl.
CPC .............. *H01L 21/78* (2013.01); *H01L 21/50* (2013.01); *H01L 21/54* (2013.01); *H01L 21/561* (2013.01);
(Continued)

(58) Field of Classification Search
None
See application file for complete search history.

(56) References Cited

U.S. PATENT DOCUMENTS 6,541,310 B1 * 4/2003 Lo .......................... H01L 21/561
257/706
6,979,594 B1 * 12/2005 Fan ....................... H01L 21/561
257/E23.069

(Continued)

FOREIGN PATENT DOCUMENTS

TW 451437 8/2001

*Primary Examiner* — Whitney T Moore
*Assistant Examiner* — Herve Assouman
(74) *Attorney, Agent, or Firm* — Li & Cai Intellectual Property (USA) Office

(57) ABSTRACT

A fan-out wafer level chip package structure and the manufacturing method thereof are provided. The method includes the steps of providing a supporting plate having a removable tape formed on the supporting plate, placing a plurality of chips on the removable tape, applying an adhesive layer on a back surface of each of the chips, providing a conductive cover for covering all chips and isolating the chips from each other by a plurality of partitions, injecting a molding compound into an inside of the conductive cover and curing the molding compound for forming an encapsulation, separating the encapsulation from the supporting plate, forming a connection layer on an active surface of each of the chips to establish electrical connections, and performing a cutting process to divide the encapsulation into a plurality of the package structures.

11 Claims, 14 Drawing Sheets

(51) Int. Cl.
    *H01L 21/56* (2006.01)
    *H01L 23/043* (2006.01)
    *H01L 23/24* (2006.01)
    *H01L 21/50* (2006.01)
    *H01L 21/54* (2006.01)
    *H01L 23/492* (2006.01)
    *H01L 21/683* (2006.01)
    *H01L 23/00* (2006.01)

(52) U.S. Cl.
    CPC ........ *H01L 21/6835* (2013.01); *H01L 23/043* (2013.01); *H01L 23/24* (2013.01); *H01L 23/492* (2013.01); *H01L 24/19* (2013.01); *H01L 24/20* (2013.01); *H01L 24/24* (2013.01); *H01L 24/82* (2013.01); *H01L 24/97* (2013.01); *H01L 21/565* (2013.01); *H01L 21/568* (2013.01); *H01L 23/49562* (2013.01); *H01L 23/49575* (2013.01); *H01L 24/27* (2013.01); *H01L 24/29* (2013.01); *H01L 24/32* (2013.01); *H01L 24/83* (2013.01); *H01L 24/92* (2013.01); *H01L 2221/68372* (2013.01); *H01L 2224/04105* (2013.01); *H01L 2224/06181* (2013.01); *H01L 2224/12105* (2013.01); *H01L 2224/24247* (2013.01); *H01L 2224/2732* (2013.01); *H01L 2224/27318* (2013.01); *H01L 2224/2919* (2013.01); *H01L 2224/2929* (2013.01); *H01L 2224/29294* (2013.01); *H01L 2224/29311* (2013.01); *H01L 2224/29339* (2013.01); *H01L 2224/29347* (2013.01); *H01L 2224/32245* (2013.01); *H01L 2224/73267* (2013.01); *H01L 2224/83005* (2013.01); *H01L 2224/83191* (2013.01); *H01L 2224/83851* (2013.01); *H01L 2224/92244* (2013.01); *H01L 2224/97* (2013.01); *H01L 2924/1203* (2013.01); *H01L 2924/13091* (2013.01); *H01L 2924/15153* (2013.01)

(56) References Cited

U.S. PATENT DOCUMENTS

| | | | | |
|---|---|---|---|---|
| 7,759,163 B2 * | 7/2010 | Kroeninger | ........... | H01L 21/568 257/690 |
| 2005/0046015 A1 * | 3/2005 | Shim | ............ | H01L 21/565 257/713 |
| 2005/0046035 A1 * | 3/2005 | Egawa | ............ | H01L 23/13 257/777 |
| 2013/0175700 A1 * | 7/2013 | Chen | ............ | H01L 24/94 257/774 |

\* cited by examiner

FAN-OUT WAFER LEVEL CHIP PACKAGE STRUCTURE AND MANUFACTURING METHOD THEREOF

BACKGROUND OF THE INVENTION

1. Field of the Invention

The instant disclosure relates to a semiconductor package process, in particular, to a fan-out wafer level chip package structure and manufacturing method thereof.

2. Description of Related Art

As the development of portable or wearable electronic devices increases, multi-function products having small size, high efficiency, high operating speed, and high quality need to be developed to meet the recent trend. To minimize shape and size of the consumer electronic devices, wafer level chip scale packaging processes are usually used to encapsulate the chip.

In conventional packaging process, the wafer is cut to separate IC chips from each other and then IC chips are individually packaged. The difference between the wafer level chip scale packaging process and the conventional packaging process is that the whole wafer is directly packaged in wafer level chip scale packaging process so that all of IC chips fabricated on the wafer can be packaged in the same process. After the wafer level chip scale packaging process, the size of the product is equal to or slightly larger than that of the power semiconductor chip. However, the wafer level chip scale packaging process limits the variability of the fan-out layout. Accordingly, a fan-out wafer level packaging process (Fan-out WLP) has been developed in today's industry to provide more variation in layout design so as to simplify the process of adhering the packaged IC chip to the surface of a printed circuit board and improve yield.

Granted U.S. Pat. No. 7,759,163 discloses a semiconductor module and a method of manufacturing the same. Firstly, at least two semiconductor chips are placed on a carrier. The at least two semiconductor chips are then covered with a molding material to form a molded body. The molded body is thinned until the at least two semiconductor chips are exposed. Then, the carrier is removed from the at least two semiconductor chips. The at least two semiconductor chips are singulated. However, a residue of the molding material may be easily left on the surface of the semiconductor chips during the processes of forming the molded body and then thinning the molded body. In addition, if the two semiconductor chips have different heights, the active surfaces of the two semiconductor chips may be damaged during the thinning process. Furthermore, the processes of generating channels by drilling the molded body and filling the conductive material so that the back electrodes of the two semiconductor chips can extend to the active surfaces of the two semiconductor chips are too complex.

SUMMARY OF THE INVENTION

The object of the instant disclosure is to provide a fan-out wafer level chip package structure and a manufacturing method thereof. In the manufacturing method, a conductive cover is used to package the chips flipped on a supporting plate so that a thinning process performed on the encapsulation can be omitted. In addition, in the package structures provided by the embodiments of the instant disclosure, a plurality of chips can be electrically connected to each other through the conductive cover and a connection layer.

In order to achieve the aforementioned objects, according to an embodiment of the instant disclosure, a manufacturing method of wafer level chip scale package structure is provided. Firstly, a supporting plate having a supporting surface and a removable tape formed on the supporting surface is provided. A plurality of chips is disposed on the supporting surface. Each of the chips has an active surface and a back surface, and the active surface is attached to the removable tape. An adhesive layer is applied on the back surface of each of the chips. A conductive cover including a bottom plate and a plurality of partition plates arranged on the bottom plate is provided, in which a plurality of accommodating regions is defined by the partition plates. Subsequently, the conductive cover is attached to the supporting surface to cover the chips, which are respectively accommodated in the accommodating regions and isolated from each other by the partition plates. Next, a molding compound is injected into an inside of the conductive cover to fill the spaces formed between the partition plates and the chips. A curing process is performed to form an encapsulation. Subsequently, the encapsulation is separated from the supporting plate, and each of the active surfaces of the chips is located on a first surface of the encapsulation. A connection layer is formed on the first surface to establish electrical connections among the chips. Thereafter, a cutting process is performed to divide the encapsulation into a plurality of separated package structures. Each of the package structures includes a conductive frame, which is formed by cutting the conductive cover, and a wiring layer, which is formed by cutting the connection layer.

According to an embodiment of the instant disclosure, a package structure adapted to a voltage convertor circuit is provided. The package structure includes a conductive frame, a first power transistor, a second power transistor, and a wiring layer. The conductive frame has a bottom portion and a first partition plate to form a first accommodating region and a second accommodating region, and the first partition plate is located between the first accommodating region and the second accommodating region. The bottom portion is divided into a first conductive portion and a second conductive portion, which are insulated from each other, and the second conductive portion is electrically connected to the first partition plate. The first and second power transistors are respectively packaged in the first and second accommodating regions. A drain of the first power transistor is electrically connected to the first conductive portion, and a drain of the second power transistor is electrically connected to the second conductive portion. The wiring layer is electrically connected to a first active surface of the first power transistor and a second active surface of the second power transistor. In addition, an ending surface of the first partition plate, the first active surface of the first power transistor, and the second active surface of the second power transistor are coplanar. A source of the first power transistor is electrically connected to the drain of the second power transistor through the first partition plate and the second conductive portion.

According to another embodiment of the instant disclosure, a package structure is provided. The package structure includes the abovementioned first and second power transistors and a control chip packaged in the first accommodating region. The control chip is insulated from the first conductive portion, and the wiring layer is formed on the control chip, the first active surface of the first power transistor, and the second active surface of the second power transistor so as to electrically connect the control chip, the first power transistor, and the second power transistor.

In the manufacturing method of a chip package structure according to an embodiment of the instant disclosure, the size of the package structure can be controlled by performing the steps of using a conductive cover to cover the chips, injecting the molding compound into the spaces among the chips and conductive cover, and performing a curing process. Accordingly, the thinning process performed on the encapsulation can be omitted. In addition, different package structures can be formed by changing the position and depth during the cutting process.

In order to further the understanding regarding the instant disclosure, the following embodiments are provided along with illustrations to facilitate the disclosure of the instant disclosure.

DETAILED DESCRIPTION OF THE PREFERRED EMBODIMENTS

In the following description, numerous specific details of fan-out wafer level chip package structure and the manufacturing method thereof according to the embodiments of the instant disclosure are set forth in order to provide a thorough understanding of one or more aspects and/or features described herein. It will be apparent, to one skilled in the art, to readily understand the advantages and the effectiveness of the instant disclosure. Furthermore, the instant disclosure can also be implemented or applied by various other specific examples. The details in the following descriptions can also be modified or changed based on different perspectives and applications without departing from the spirit of the instant disclosure. In addition, the drawings as referred to throughout the description of the instant disclosure are for illustrative purpose only, but not drawn according to actual scale, i.e., the actual scale of the related structure is not illustrated. The relative techniques of the instant disclosure will be set forth through the following embodiments, but are not intended to limit the scope of the instant disclosure.

Figure 1:
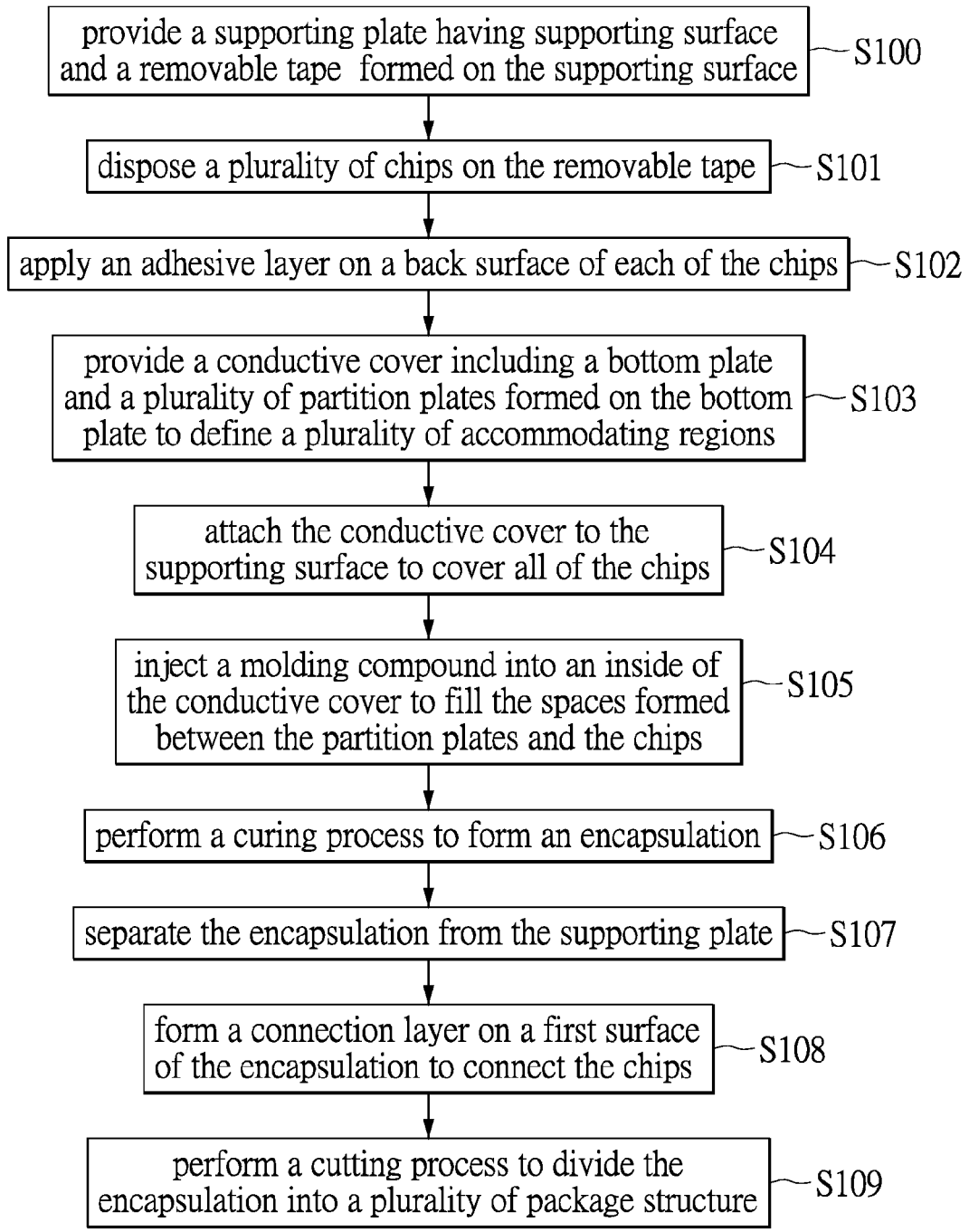
FIG. 1 shows a flow chart of the manufacturing method of fan-out wafer level chip package structure in accordance with an embodiment of the instant disclosure.

Please refer to FIG. 1. FIG. 1 shows a flow chart of the manufacturing method of fan-out wafer level chip package structure in accordance with an embodiment of the instant disclosure. The manufacturing method of fan-out wafer level chip package structure can be applied in the package process of the chips.

In step S100, a supporting plate is provided. The supporting plate has a supporting surface and a removable tape formed thereon. In step S101, a plurality of chips is placed on the removable tape, and each of the chips has an active surface and a back surface and is attached on the removable tape with the active surface. In step S102, an adhesive layer is applied on each of back surfaces of the chips. In step S103, a conductive cover including a bottom plate and a plurality of partition plates formed on the bottom plate is provided, in which a plurality of accommodating regions is defined by the partition plates.

In step S104, the conductive cover is attached on the supporting surface to cover all of the chips, which are respectively accommodated in the accommodating regions and isolated from each other by the partition plates. In step S105, a molding compound is injected into an inside of the conductive cover to fill the spaces formed between the partition plates. In step S106, a curing process is performed to form an encapsulation. In step S107, the encapsulation is separated from the supporting plate, and each of the active surfaces of the chips is located on a first surface of the encapsulation.

In step S108, a connection layer is formed on the first surface of the encapsulation so as to connect to at least two of the chips to an external circuit. In step S109, a cutting process is performed to divide the encapsulation into a plurality of separated package structures, and each of package structures includes a conductive frame, which is formed by cutting the conductive cover, and a wiring layer, which is formed by cutting the connection layer.

Figure 2:
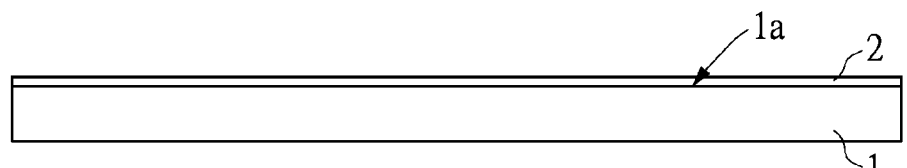
FIG. 2 shows a sectional view of localized supporting plate in accordance with an embodiment of the instant disclosure.

The following description further explains the details in each of steps shown in FIG. 1. Please refer to FIG. 2. FIG. 2 shows a sectional view of a localized supporting plate in accordance with an embodiment of the instant disclosure. The supporting plate 1 has a supporting surface 1a and a removable tape 2 formed thereon.

The supporting plate 1 can be made of a conductive or insulate material, such as metal, alloy, plastic, or silica glass, and so on. In addition, the removable tape 2 can be laminated on the supporting plate 1. In one embodiment, the removable tape 2 can be a double sided tape. In the instant embodiment of the instant disclosure, the supporting plate 1 has the same shape and size as that of a wafer, such as with six inch, eight inch or twelve inch diameter. In another embodiment, the supporting plate 1 has a square shape.

Figure 3A:
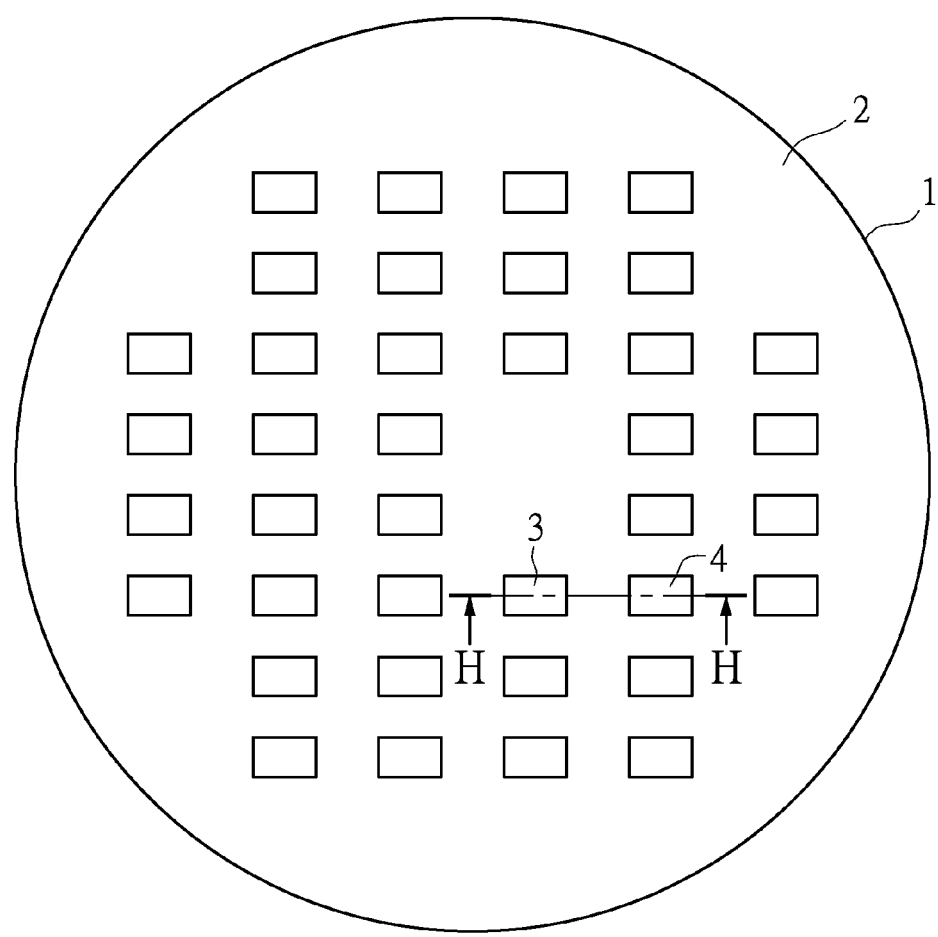
FIG. 3A shows a top view of a package structure in step S101 shown in FIG. 1.

Please refer to FIG. 3A. FIG. 3A shows a top view of a package structure in step S101 shown in FIG. 1. In the instant embodiment, the different or the same kinds of chips can be reconfigured in advance. That is, the chips may be respectively fixed on different predetermined positions of the removable tape 2 according to design requirements.

The chips may be the same or different semiconductor devices, such as power transistors, integrated circuit devices, or diode devices, and so on. The power transistor is, for example, a vertical power transistor, an insulated gate bipolar transistor (IGBT), or a bottom-source lateral diffusion MOSFET. Each of the chips has an active surface and a back surface, and the active surfaces of the chips are attached to the removable tape 2.

Figure 3B:
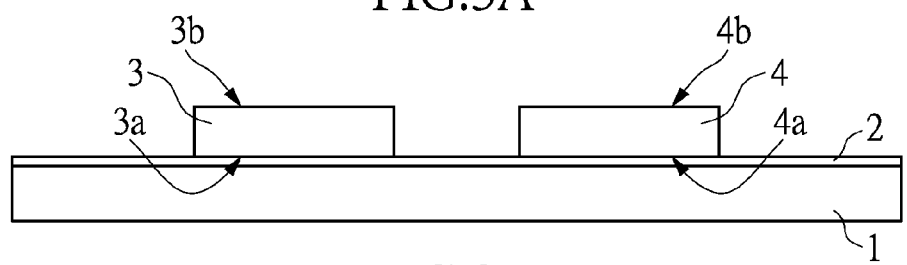
FIG. 3B shows a sectional view taken along a line H-H in FIG. 3A.

In the instant embodiment, taking a first chip 3 and a second chip 4 immediately adjacent to each other as examples for description, please refer to FIG. 3B. FIG. 3B which shows a sectional view taken along a line H-H in FIG. 3A. The first chip 3 has a first active surface 3a and a first back surface 3b opposite thereto. As shown in FIG. 3B the first chip 3 is arranged on the removable tape 2 with the first active surface 3a facing to the removable tape 2. Similar to the first chip 3, the second chip 4 has a second active surface 4a and a second back surface 4b, and the second chip 4 is attached to the removable tape 2 with the second active surface 4a facing to the removable tape 2.

In one embodiment, the first and second chips 3 and 4 are respectively a first power transistor and a second power transistor. A gate (not labeled) and a source (not labeled) of the first chip 3 are formed on the first active surface 3a, and a drain (not labeled) is formed on the first back surface 3b of the first chip 3. Similarly, a gate (not labeled) and a source (not labeled) of the second chip 4 are formed on the second active surface 4a, and a drain (not labeled) of the second chip 4 is formed on the second back surface 4b of the second chip 4.

Figure 4:
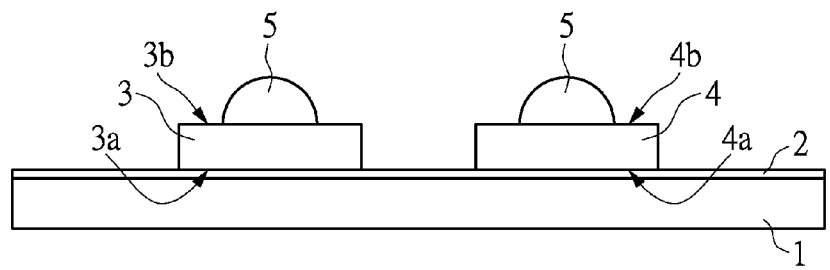
FIG. 4 shows a sectional view of the localized package structure in a step of the manufacturing method in FIG. 1 in accordance with an embodiment of the instant disclosure.

Please refer to FIG. 4. FIG. 4 shows a sectional view of the localized package structure in a step S102 of the manufacturing method in FIG. 1 in accordance with an embodiment of the instant disclosure. As shown in FIG. 4, an adhesive layer 5 is coated on each of the back surfaces of the chips. In one embodiment, a suitable quantity of the adhesive layer 5 can be placed on each back surface of the chips by dispensing or screen printing. The adhesive layer 5 can be selected from the conductive paste or the insulation paste according to the kinds of the chips and the circuit design requirement. The conductive paste is, for example, a silver paste, a tin paste, a copper paste, or the like. The insulation paste can be a thermal insulation adhesive.

In the embodiment shown in FIG. 4, the first and second chips 3 and 4 are vertical power transistors, and thus the adhesive layer 5 coated on the first back 3b of the first chip 3 and the second back 4b of the second chip 4 is conductive paste. However, in another embodiment, when the chip is a control chip, the adhesive is insulation paste.

Figure 5A:
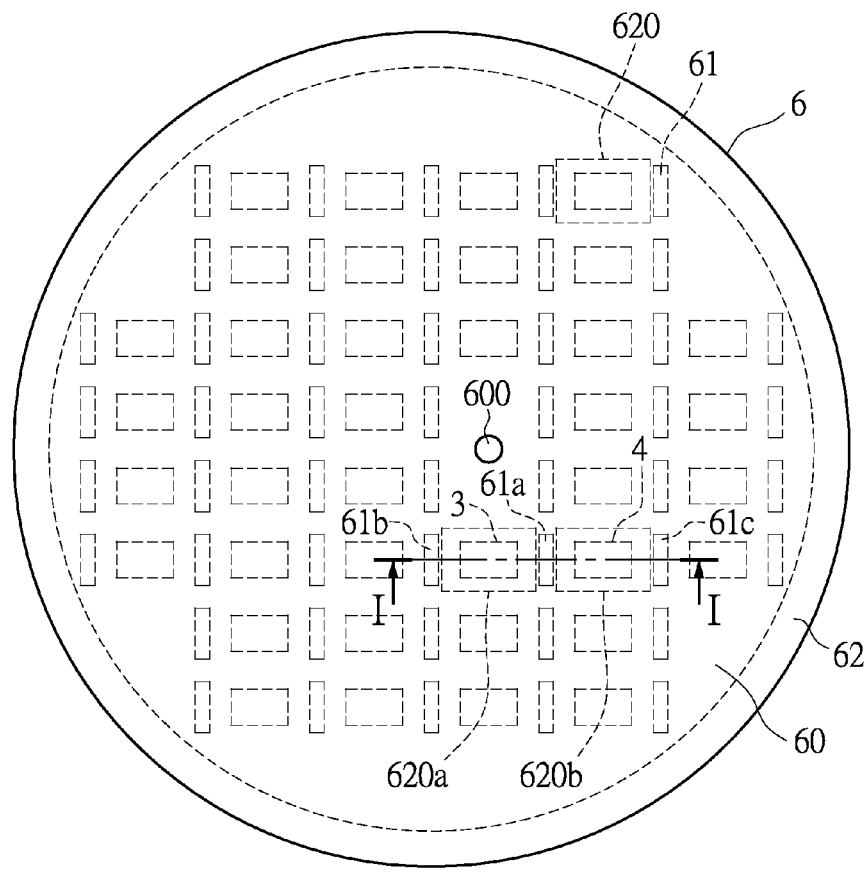
FIG. 5A shows a top view of the package structure in a step of the manufacturing method in FIG. 1 in accordance with an embodiment of the instant disclosure.
Figure 5B:
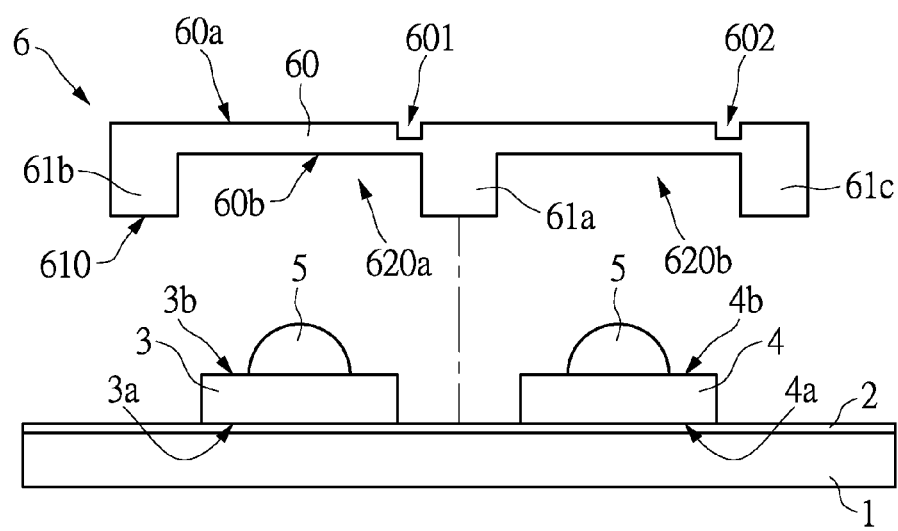
FIG. 5B shows a sectional view taken along a line I-I in FIG. 5A.

Please refer to FIGS. 5A and 5B. FIG. 5A shows a top view of the package structure in a step S103 of the manufacturing method in FIG. 1 in accordance with an embodiment of the instant disclosure, and FIG. 5B shows a sectional view taken along a line I-I in FIG. 5A. The conductive cover 6 can be made of copper, Fe—Ni alloy or another alloy. In the instant embodiment, the conductive cover 6 is made of copper alloy, and has a thickness ranging from 25 to 1000 μm. In addition, the conductive cover 6 can be fabricated by, but is not limit to, etching, punching, or stamping.

In the embodiment shown in FIG. 5A, the conductive cover 6 has a bottom plate 60, a rim 62 and a plurality of partition plates 61, in which the bottom plate 60 and the rim 62 define an arrangement space, and a plurality of partition plates 61 divides the arrangement space into a plurality of the accommodating regions 620, which are in fluid communication with each other.

The bottom plate 60 can have a circular shape, a square shape, or other geometric shape according to the shape of the supporting plate 1 or an arranged shape of the chips, but the shape of the bottom plate 60 is not intended to limit the instant disclosure. Specifically, the bottom plate 60 has a first surface 60a and a second surface 60b opposite thereto, in which the first surface 60a is located on the back of the conductive cover 6. In one embodiment, the conductive cover 6 has an injection molding hole 600 formed on the bottom plate 60. Notably, in the instant embodiment, the injection molding hole 600 is formed on the bottom plate 60, but in another embodiment, the injection molding hole 600 can be formed on the rim 62, and the abovementioned embodiments are not intended to limit the scope of the instant disclosure.

In addition, in the instant embodiment, a plurality of cutting marks 601 (only one is shown in FIG. 5B) and cutting grooves 602 (only one is shown in FIG. 5B) respectively corresponding to different accommodating regions 620 are pre-formed on the first surface 60a of the bottom plate 60. The positions of the cutting marks 601 and the cutting grooves 602 are staggered with respect to the positions of the partition plates 61. In the instant embodiment, each of the cutting marks 601 can be a notch to define a position of an insulating trench which will be formed in the following steps. The cutting grooves 602 are used to define the boundaries of each of the package structures. The functions of the cutting marks 601 and the cutting grooves 602 will be described in detail in the following description. In one embodiment, the cutting groove 602 has a width of 50 μm.

The rim 62 protrudes from the second surface 60b of the bottom plate 60 and is surroundingly disposed on the peripheral region of the bottom plate 60. In addition, the arrangement space defined by the rim 62 and the bottom plate 60 is capable of accommodating all of the chips. The partition plates 61 protrude from the second surface 60b of the bottom plate 60 to divide the arrangement space into a plurality of the accommodating regions 620, which are in fluid communication with each other. The accommodating regions 620 are for respectively accommodating the chips, and the size of each of the accommodating regions 620 can be designed according to the size of the chips.

In one embodiment, the partition plates 61 are arranged in an array form on the bottom plate 60, and two of the immediately adjacent partition plates 61 can be separated from each other by a space which may slightly larger than the width of each of the chips. Additionally, the height of the rim 62 and a height of each of the partition plates 61 are greater than a thickness of each of the chips.

In the embodiment shown in FIG. 5B, take a first partition plate 61a, a second partition plate 61b, and a third partition plate 61c as examples for description. Specifically, a first accommodating region 620a and a second accommodating region 620b are defined among the first partition plate 61a, the second partition plate 61b, and the third partition plate 61c, and the first partition plate 61a is located between the first and second accommodating regions 620a and 620b.

Figure 5C:
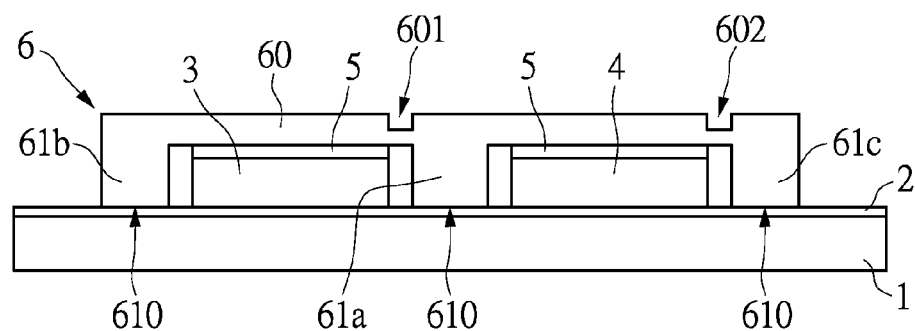
FIG. 5C shows a sectional view of the localized package structure in a step of the manufacturing method in FIG. 1 in accordance with an embodiment of the instant disclosure.

In addition, please refer to FIGS. 5A and 5C, in which FIG. 5C shows a sectional view of the localized package structure in a step S104 of the manufacturing method in FIG. 1 in accordance with an embodiment of the instant disclosure. In step S104, the conductive cover 6 is attached to the supporting surface 1a to cover all of the chips. As shown in FIG. 5C, when the conductive cover 6 covers the supporting surface 1a, the first and second chips 3 and 4 are respectively accommodated in the first and second accommodating regions 620a and 620b. That is, the first partition plate 61a is located between the first and second chips 3 and 4.

In addition, in one embodiment, when the conductive cover 6 is attached to the supporting surface 1a, the ending surfaces 610 of the rim 62 and each of the partition plates 61 are also in contact with and adhered to the removable tape 2 so that the first active surface 3a of the first chip 3, the second active surface 4a of the second chip 4, and the ending surfaces 610 of the partition plates 61 are coplanar. In addition, the arrangement space of the conductive cover 6 is in fluid communication with the outside only through the injection molding hole 600.

The first chip 3 is adhered to the conductive cover 6 with the adhesive layer 5 placed on the first back surface 3b. In the instant embodiment, when the first chip 3 is a vertical power transistor, the adhesive layer 5 is conductive paste so that the drain of the first chip 3 can be electrically connected to the conductive cover 6 by the adhesive layer 5. Similarly, the drain of the second chip 4 can be electrically connected to the conductive cover 6 by the adhesive layer 5. In another embodiment, when the chip is the control chip, the adhesive layer 5 is insulation paste so that the chip and the conductive cover 6 are insulated from each other.

Figure 6:
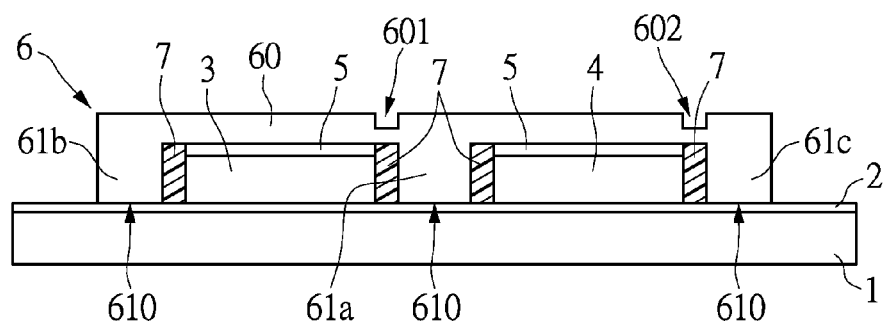
FIG. 6 shows a sectional view of the localized package structure in a step of the manufacturing method in FIG. 1 in accordance with an embodiment of the instant disclosure.

Subsequently, please refer to FIG. 6, which shows a sectional view of the localized package structure in steps S105 and S106 of the manufacturing method in FIG. 1 in accordance with an embodiment of the instant disclosure. In step S105, the molding compound 7 is injected into the inside of the conductive cover 6 to fill the spaces formed between the partition plates and the chips. The molding compound 7 can be any suitable thermoplastic material or thermosetting material, such as epoxy material, silicon resin, or photoresist, and so on. In one embodiment, the molding compound 7 can cover each of chips respectively accommodated in the accommodating regions 620 by using the compression molding or injection molding technique.

In the instant embodiment, before the molding compound 7 is injected into the inside of the conductive cover 6 through the injection molding hole 600, the arrangement space is vacuumed through the injection molding hole 600 of the bottom plate 60. In addition, the molding compound 7 is liquid silicon resin.

Notably, the vacuum arrangement space can improve the inhalation and the workability of the molding compound 7 so that the molding compound 7 easily flows to each of accommodating regions 620 to diminish the generation of voids. In an embodiment, during the injection of the molding compound 7, the supporting plate 1 is continuously or intermittently rotated to bring the rotation of the conductive cover 6, which also can assist the molding compound 7 to flow and fill into each of the accommodating regions 620 more quickly.

Subsequently, in step S106, the curing process is performed to form an encapsulation. In the instant embodiment of the instant disclosure, a thermal process is performed to cure the molding compound 7. In an embodiment shown in FIG. 6, the first and second accommodating regions 620a and 620b are filled with the molding compound 7 to encapsulate the first and second chips 3 and 4. After the curing process, a first molding 7a and a second molding 7b are respectively formed in the first and second accommodating regions 620a and 620b.

Figure 7:
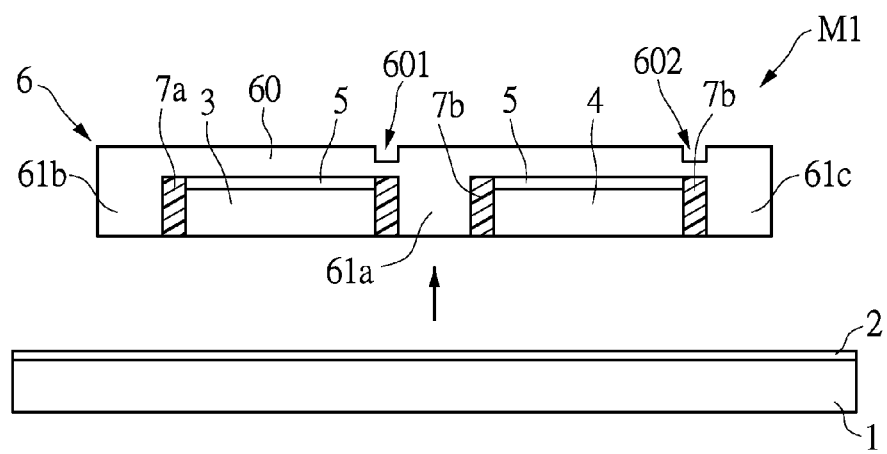
FIG. 7 shows a sectional view of the localized package structure in a step of the manufacturing method in FIG. 1 in accordance with an embodiment of the instant disclosure.

Please refer to FIG. 7. FIG. 7 shows a sectional view of the localized package structure in a step S107 of the manufacturing method in FIG. 1 in accordance with an embodiment of the instant disclosure. In step S107, the encapsulation M1 is separated from the supporting plate 1.

The first active surface 3a of the first chip 3, the second active surface 4a of the second chip 4, and the ending surfaces 610 of the first partition plate 61a, the second partition plate 61b, and the third partition plate 61c are located at the first surface (a surface of the conductive cover 6 facing down shown in FIG. 7) of the encapsulation M1. In addition, in the instant embodiment, the second surface (a surface of the conductive cover 6 facing up shown in FIG. 7) of the encapsulation M1 is the first surface 60a of the bottom plate 60 of the conductive cover 6. After the above-mentioned processes are performed, the structure of the encapsulation M1 is more planer. Specifically, the ending surface 610 of the first partition plate 61a and the first active surface 3a of the first chip 3 are coplanar, and the warpage deformation of the encapsulation M1 can be avoided as much as possible. In addition, the encapsulation M1 does not need to be thinned.

Figure 8:
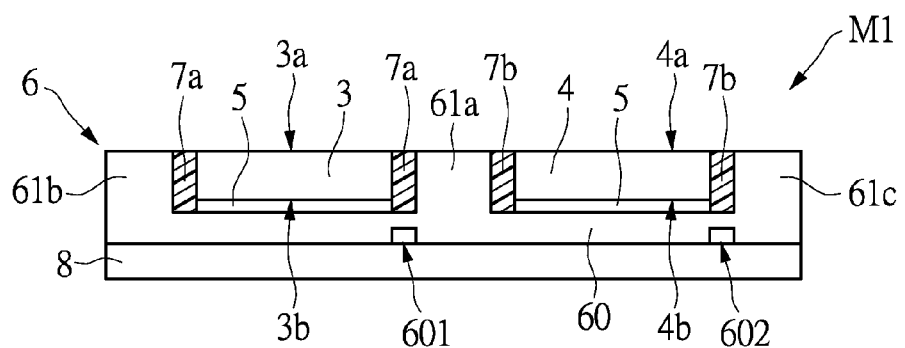
FIG. 8 shows a sectional view of the localized package structure before a step of forming the connection layer in accordance with an embodiment of the instant disclosure.
Figure 9:
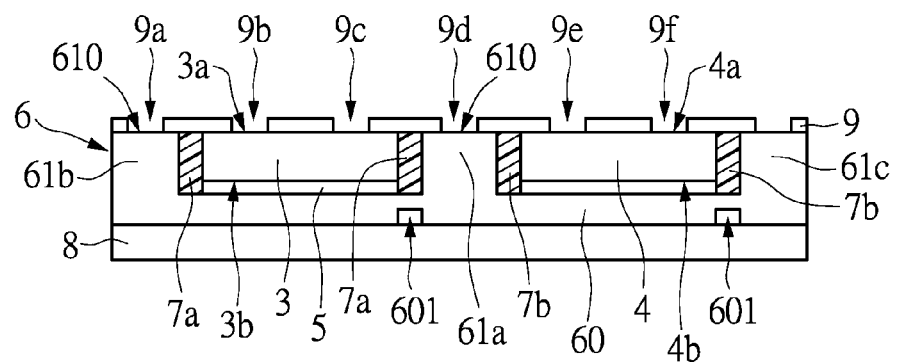
FIG. 9 shows a sectional view of the localized package structure before a step of forming the connection layer in accordance with an embodiment of the instant disclosure.

In step S108, the connection layer is formed on the first surface of the encapsulation to connect the chips to each other. In one embodiment, before the connection layer is formed on the first surface of the encapsulation M1, the encapsulation M1 can be flipped over, i.e., the first surface of the encapsulation is arranged facing up and the second surface is arranged facing down, as shown in FIG. 8, and placed on a substrate 8 so that the encapsulation M1 is connected to the substrate 8 with the second surface. In addition, a protective layer can be selectively formed on the first surface of the encapsulation M1. Please refer to FIG. 8 to FIG. 9. FIGS. 8 and 9 respectively show the sectional views of the localized package structure in different steps before the connection layer is formed in accordance with an embodiment of the instant disclosure. In the step shown in FIG. 8, the encapsulation M1 is disposed on the substrate 8 with the second surface facing to the substrate 8. In addition, the substrate 8 is mainly used to support the encapsulation M1, and can be made of glass, plastic, or other material, which is not intended to limit the instant disclosure.

Please refer to FIG. 9. As illustrated in FIG. 9, a patterned protective layer 9 is formed to cover the first surface of the encapsulation M1. The patterned protective layer 9 can protect the active surfaces of the chips from being contaminations during the following processes and define the positions and area for the formation of the connection layer. Specifically, the patterned protective layer 9 has a plurality of openings 9a-9f to expose the gates and sources of the first and second chips 3 and 4, and the ending surfaces 610 of the first and second partition plates 61a and 61b.

The patterned protective layer 9 can be formed by any conventional technique, for example, by deposition, lithography, and etching processes. In one embodiment, the patterned protective layer is a dielectric layer, such as phosphosilicate glass, polyimide or nitride. However, in another embodiment, if a passivation layer or a protecting layer has been formed on the active surfaces of the chips, the step shown in FIG. 9 could be omitted.

Figure 10:
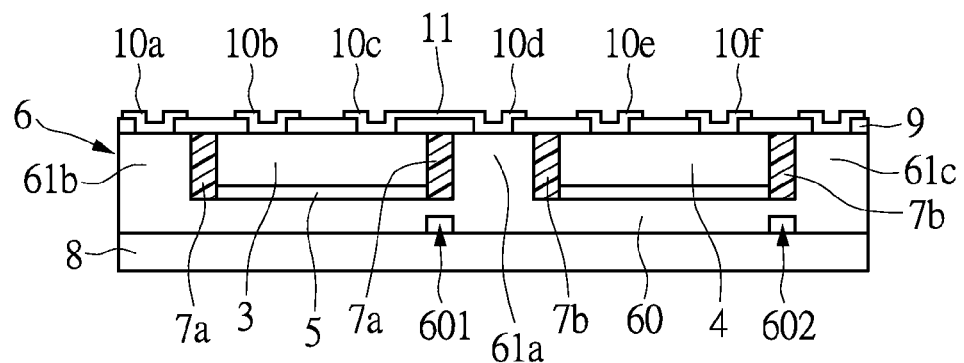
FIG. 10 shows a sectional view of the localized package structure during a step of forming the connection layer in accordance with an embodiment of the instant disclosure.
Figure 11:
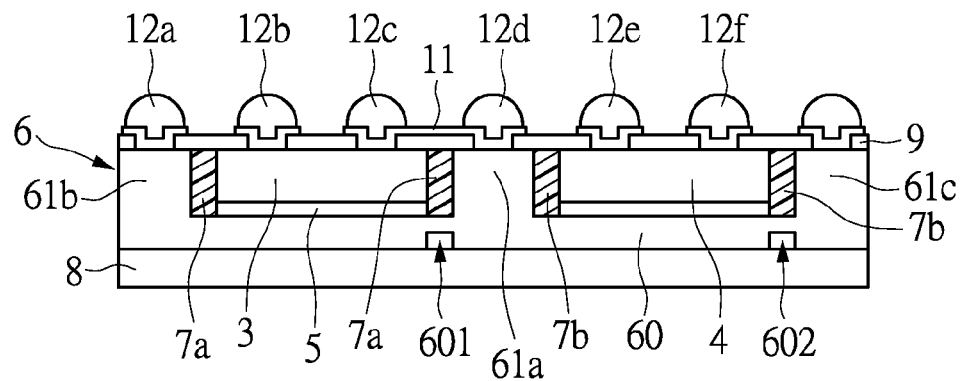
FIG. 11 shows a sectional view of the localized package structure during a step of forming the connection layer in accordance with an embodiment of the instant disclosure.

In an embodiment, the connection layer can include a plurality of under-bump metals (UBM), a conductive wiring layer, and a plurality of pads. Please refer to FIGS. 10 and 11. FIGS. 10 and 11 respectively show the sectional views of the localized package structure in different steps during the formation of the connection layer in accordance with an embodiment of the instant disclosure.

As shown in FIG. 10, the under-bump metals 10a-10f are respectively formed in the openings 9a-9f. The under-bump metals 10a-10f are respectively in contact with the ending surface 610 of the second partition plate 61b, the gate and source of the first chip 3, the ending surface 610 of the first partition plate 61a, and the gate and source of the second chip 4. Additionally, the conductive wiring layer 11 is formed on the patterned protective layer 9 to connect the under-bump metal 10c to under-bump metal 10d.

It is worth noting that the under-bump metal 10c is electrically connected to the source of the first chip 3, and the other under-bump metal 10d is electrically connected to the drain of the second chip 4. That is to say, the conductive wiring layer 11 connecting between the two under-bump metals 10c-10d can establish an electrical connection between the source of the first chip 3 and the drain of the second chip 4.

Subsequently, as shown in FIG. 11, the pads 12a-12f are respectively formed on the under-bump metals 10a-10f to serve as the contacts for connecting an external circuit. Specifically, in the embodiment shown in FIG. 11, the pad 12a disposed on the ending surface 610 of the second partition plate 61b is electrically connected to the drain of the first chip 3, thus the pad 12a can serve as a VIN pad. In addition, the pads 12b and 12e, which are respectively deposited on the gate of the first chip 3 and the gate of the second chip 4, can respectively serve as a high-side gate pad and a low-side gate pad.

As mentioned above, the source of the first chip 3 and the drain of the second chip 4 are electrically connected to each other through the conductive wiring layer 11, the first partition plate 61a and the bottom plate 60. Accordingly, either the pad 12c disposed on the source of the first chip 3 or the pad 12d disposed on the ending surface 610 of the first partition plate 61a can serve as a switch contact pad (SW).

Furthermore, the pad 12f disposed on the source of the second chip 4 can serve as a ground pad. In the instant embodiment, the second chip 4 has a plurality of sources, and a plurality of pads 12f are used to be respectively deposited on the sources. All of these pads 12f can serve as the ground pads.

In the abovementioned embodiment, assume that the first and second chips 3 and 4 are vertical power transistor for description. When the first and second chips 3 and 4 are other semiconductor devices, the layout of the connection layer can be varied according to the design requirements and the applied circuit conditions. Accordingly, the examples of the connection layer in the embodiments are not intended to limit the scope of the instant disclosure.

After the fabrication of the connection layer is completed, the substrate 8 is removed from the second surface of the encapsulation M1. At this time, the chips can be tested, marked by a laser, or performed on by other processes.

Figure 12A:
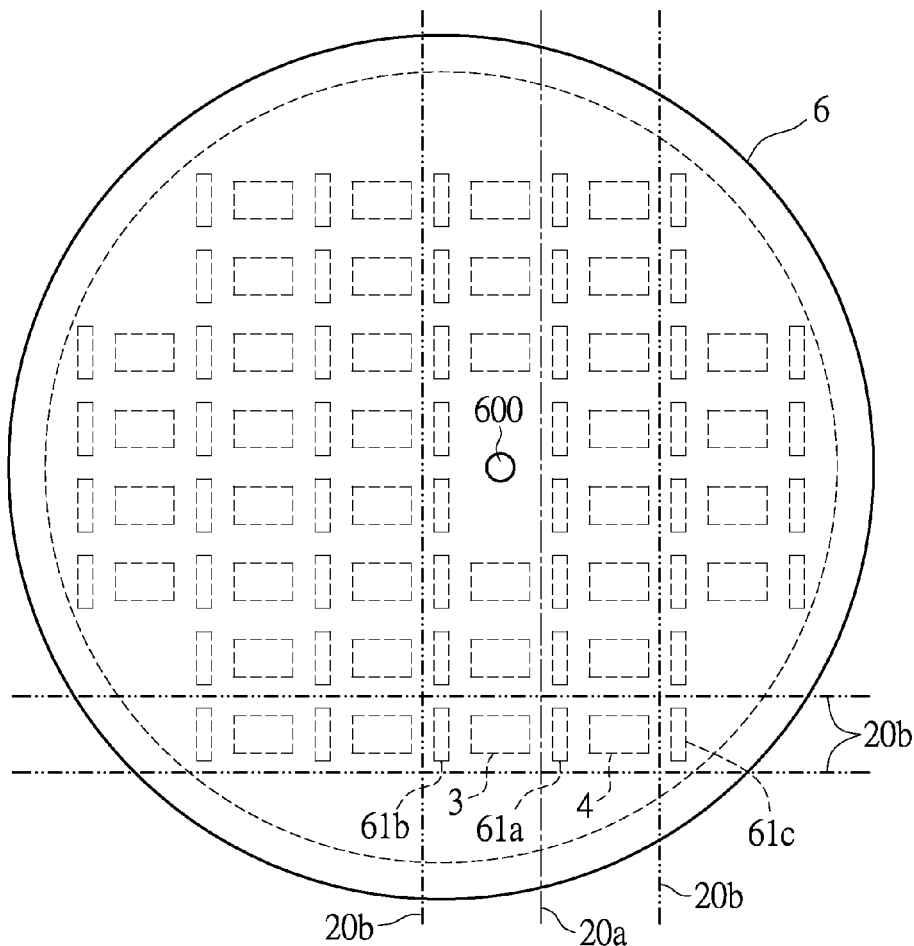
FIG. 12A shows a top view of the package structure in a step of the manufacturing method in FIG. 1 in accordance with another embodiment of the instant disclosure.
Figure 12B:
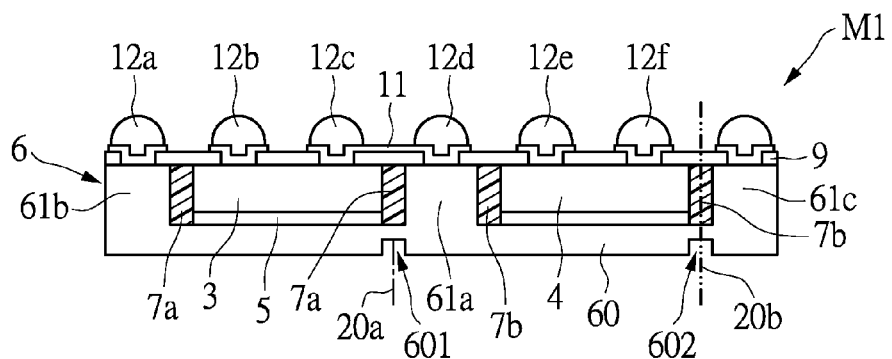
FIG. 12B shows a sectional view of the localized package structure before a step S109 of the manufacturing method in FIG. 1 in accordance with an embodiment of the instant disclosure.

Subsequently, please refer to FIGS. 12A and 12B. FIG. 12A shows a top view of the package structure in a step S109 of the manufacturing method in FIG. 1 in accordance with another embodiment of the instant disclosure, and FIG. 12B shows a sectional view of the localized package structure before a step S109 of the manufacturing method in FIG. 1 in accordance with an embodiment of the instant disclosure. Please refer to FIG. 13, which shows a sectional view of the package structure after a step S109 of the manufacturing method in FIG. 1 in accordance with an embodiment of the instant disclosure.

In step S109, the cutting process is performed to divide the encapsulation M1 into a plurality of separated package structures, and each of package structures includes a conductive frame, which is formed by cutting the conductive cover 6, and a wiring layer, which is formed by cutting the connection layer. The cutting process is performed on the second surface of the encapsulation M1 by a mechanism tool (such as a diamond cutter) or wet etching.

Figure 13:
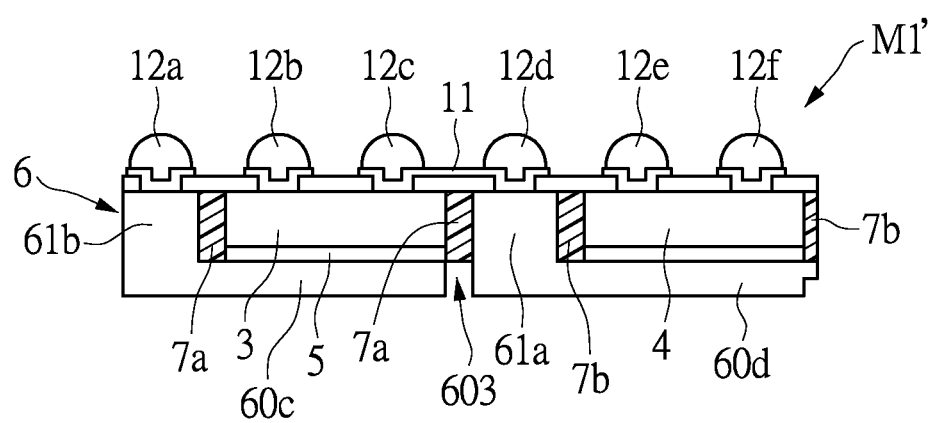
FIG. 13 shows a sectional view of the package structure after a step S109 of the manufacturing method in FIG. 1 in accordance with an embodiment of the instant disclosure.

In the instant embodiment of the instant disclosure, the cutting position and the cutting depth are adjustable according to the operating way of the chips implemented in the circuit to form different kinds of package structures. In the embodiment shown in FIG. 12A, after the encapsulation M1 is cut, the first and second chips 3 and 4 are packaged together in a first package structure M1', as shown in FIG. 13.

As mentioned above, in an embodiment of the instant disclosure, as shown in FIG. 12, the cutting marks 601 and the cutting grooves 602 which respectively have different depths have been formed on the bottom plate 60 of the conductive cover 6. As such, during the cutting process, a shallow cutting step is performed on the encapsulation M1 according to the cutting marks 601 (along a first cutting line 20a shown in FIG. 12A), and a cutting through step is performed on the encapsulation M1 according to the cutting grooves 602 (along a second cutting line 20b as shown in FIG. 12A).

Specifically, as shown in FIG. 12A, when the cutting process is performed, the shallow cutting step is performed on the second surface of the encapsulation M1 along the first cutting lines 20a according to the position of the cutting marks 601. In the shallow cutting step, only the bottom plate 60 of the conductive cover 6 connected between the first and second chips 3 and 4 is cut through to insulate the drain of the first chip 3 from the drain of the second chips 4. In addition, the first molding 7a does not need to be cut through in the shallow cutting step. Furthermore, after the shallow cutting step, at least one insulating trench 603 is formed in the back of the first package structure M1', as shown in FIG. 13.

In addition, the cutting process further includes performing a cutting through step along the second cutting lines 20b according to the position of the cutting grooves 602 to form a plurality of separated package structures. Notably, the cutting through step is not only performed in Y-direction, but also performed in X-direction along the second cutting lines 20b.

In the instant embodiment, the first package structure M1' shown in FIG. 13 can be adapted to a voltage convertor circuit, and includes a first conductive frame, a first chip 3, the second chip 4 and a first wiring layer.

Specifically, the first conductive frame at least includes a bottom portion and the first partition plate 61a. Notably, after the abovementioned cutting process, the bottom plate 60 is cut to form the base portion. The bottom portion shown in FIG. 13 includes a first conductive portion 60c and the second conductive portion 60d. The second conductive portion 60d and the first partition plate 61a define the second accommodating region 620b (the right portion shown in FIG. 13 and please refer to the corresponding portion shown in FIG. 5B). The first conductive portion 60c and the second partition plate 61b define the first accommodating region 620a (the left portion shown in FIG. 13 and please refer to the corresponding portion shown in FIG. 5B). That is to say, the first partition plate 61a is located between the first and second accommodating regions 620a and 620b.

Additionally, after the abovementioned shallow cutting step, the bottom plate 60 is cut to form the bottom portion, and the bottom portion is divided into the first conductive portion 60c and the second conductive portion 60d which are insulated from each other by the insulating trench 603. That is, the insulating trench 603 is located between the first and second conductive portions 60c and 60d. However, the first partition plate 61a is electrically connected to the second conductive portion 60d.

The first chip 3 is packaged in the first accommodating region 620a by the first molding 7a, and the drain of the first chip 3 is electrically connected to the first conductive portion 60c through the conductive paste. The second chip 4 is packaged in the accommodating region 620b by the second molding 7b, and the drain of the second chip 4 is electrically connected to the second conductive portion 60d through the conductive paste. In an embodiment of the instant disclosure, the first package structure M1' includes the second partition plate 61b. The second partition plate 61b is arranged at one side of the first conductive frame. In addition, the first and second partition plates 61a and 61b define the first accommodating region 620a.

The first wiring layer is formed on the first active surface 3a of the first chip 3 and the second active surface 4a of the second chip 4 to establish an electrical connection between the first and second chips 3 and 4. Specifically, as mentioned above, the first wiring layer can include the under-bump metals 10a-10f, the conductive wiring layer 11, and the pads 12a-12f formed in the steps shown in FIGS. 10 and 11. The first wiring layer is one of the wiring layers which are formed by cutting the connection layer on the first active surface 3a of the first chip 3 and the second active surface 4a of the second chip 4. That is, after the cutting through step is performed along the second cutting lines 20b shown in FIG. 12B, the connection layer is cut to form the wiring layer shown in FIG. 13.

Additionally, the pads 12a-12f can respectively serve as a VIN pad, a high-side gate pad, a low-side gate pad, at least one switch contact pad, and at least one ground pad. The VIN pad, such as the pad 12a, is electrically connected to the drain of the first chip 3 through the second partition plates 61b and the first conductive portion 60c. The high-side gate pad, such as the pad 12b, is electrically connected to the gate of the first chip 3, and the low-side gate pad, such as the pad 12e, is electrically connected to the gate of the second chip 4. The switch contact pad, such as the pad 12c or the pad 12d, is electrically connected to the source of the first chip 3 and the drain of the second chip 4. The ground pad, such as the pad 12f, is electrically connected to the source of the second chip 4. In the instant embodiment, the second chip 4 has two ground pads.

In the abovementioned embodiments, the first and second chips 3 and 4 are cooperated with each other in the same circuit, such as the voltage convertor circuit. Accordingly, the first and second chips 3 and 4 are packaged together in the first package structure M1'. In another embodiment, the first chip 3 and the second chip 4 immediately adjacent thereto can be individually implemented in different circuits. Depending upon the circumstance, the first chip 3 and the second chip 4 can be separated from each other during the cutting process to respectively form different package structures.

Figure 14A:
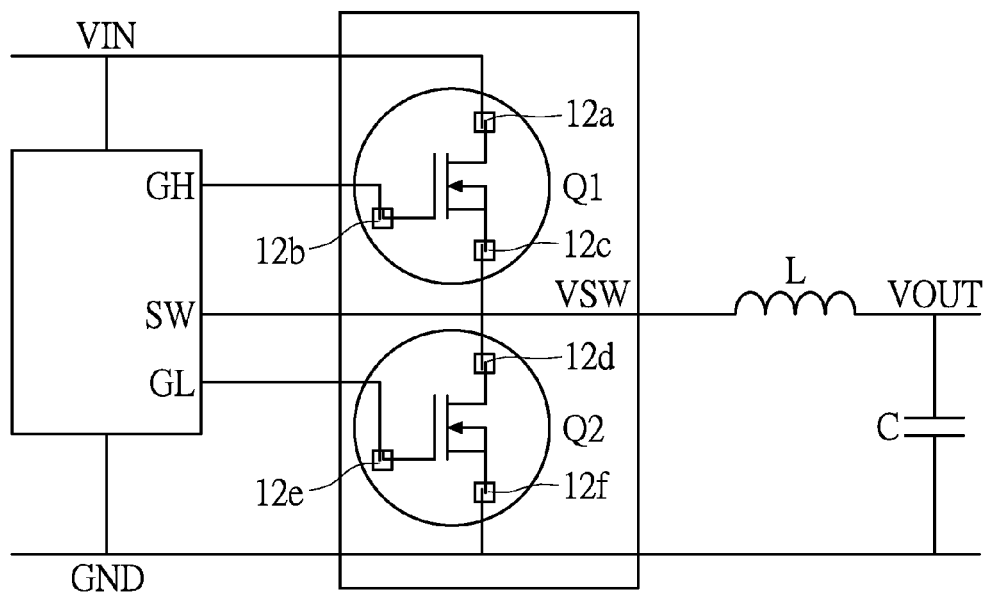
FIG. 14A shows a schematic diagram of the package structure implemented in a circuit in accordance with an embodiment of the instant disclosure.
Figure 14B:
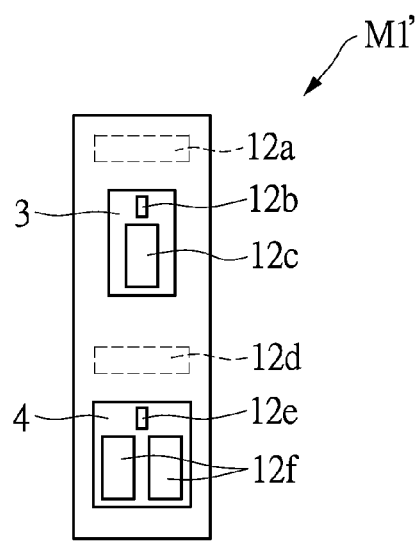
FIG. 14B shows a top view of the package structure in accordance with an embodiment of the instant disclosure.

Please refer to FIGS. 14A and 14B. FIG. 14A shows a schematic diagram of the package structure implemented in a circuit in accordance with an embodiment of the instant disclosure, and FIG. 14B shows a top view of the package structure in accordance with an embodiment of the instant disclosure. As shown in FIGS. 14A and 14B, each of the pads formed on the first package structure M1' can serve as the contacts for electrically connecting the external circuit. For example, a control device has a VIN pin, a GH pin, a SW pin, a GL pin, and a GND pin, which can be respectively electrically connected to the pad 12a, the pad 12b, the pad 12c, the pad 12d, and the pad 12f.

That is to say, in the package structure fabricated by the manufacturing method of fan-out wafer level chip package structure according to the embodiment of the instant disclosure, the electrical connections between the chips have been established by the conductive frame and the wiring layer. Accordingly, the package structure provided by the embodiment of the instant disclosure is a half-finished electronic device in reality, and can be directly implemented in the circuit.

Figure 15A:
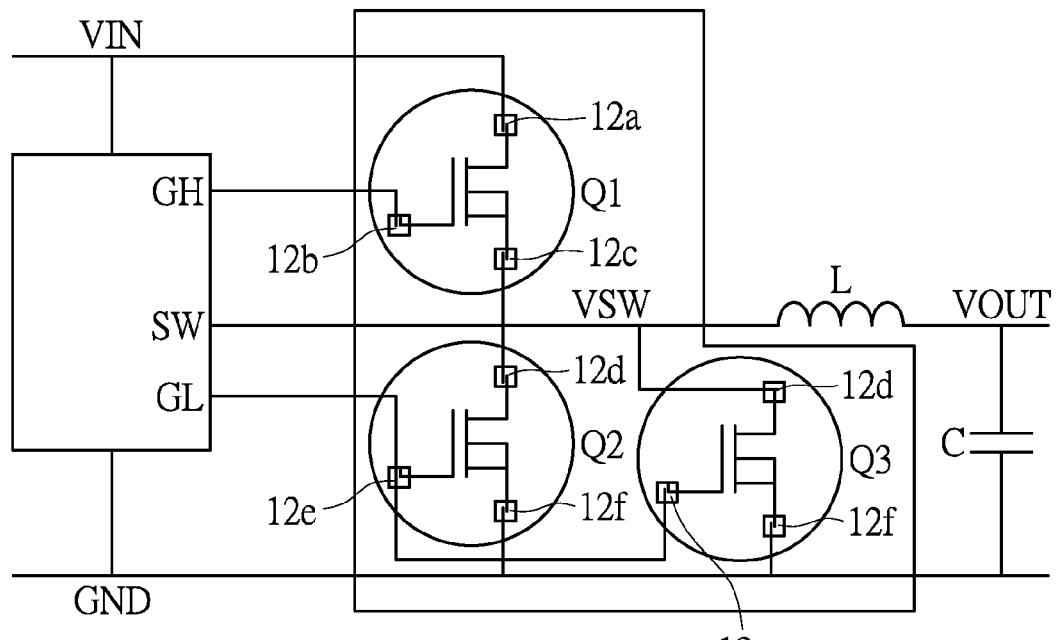
FIG. 15A shows a schematic diagram of the package structure implemented in a circuit in accordance with another embodiment of the instant disclosure.
Figure 15B:
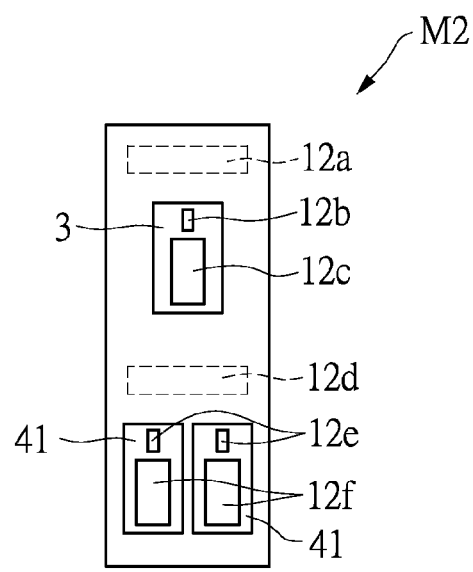
FIG. 15B shows a top view of the package structure in accordance with another embodiment of the instant disclosure.

Please refer to FIGS. 15A and 15B. FIG. 15A shows a schematic diagram of the package structure implemented in a circuit in accordance with another embodiment of the instant disclosure. FIG. 15B shows a top view of the package structure in accordance with another embodiment of the instant disclosure.

FIG. 15A illustrates another kind of voltage convertor circuit. Compared to the voltage convertor circuit shown in FIG. 14A, three power transistors are applied in the voltage convertor circuit shown in FIG. 15A. One of the power transistors is a high-side power MOSFET, and the others are low-side power MOSFETs.

In the instant embodiment, the package structure M2 implemented in the voltage convertor circuit shown in FIG. 15A can be formed by suitable designs of the cutting positions and the cutting depths. The package structure M2 has one first chip 3 and two second chips 41, and the two second chips 41 are accommodated in the second accommodating region 620b (please refer to the corresponding portion shown in FIG. 5B), and both of the drains of the two second chips 41 are electrically connected to the second conductive portion 60d (please refer to FIG. 13). In the instant embodiment, the package structure M2 can be formed by the same cutting process as the previous embodiment.

Additionally, the package structure can further include a third chip 42 in addition to the first and second chips 3 and 41. The first and second chips 3 and 41 are active devices, and the third chip 42 is a passive device, such as a diode device, as shown in FIGS. 16A and 16B.

Figure 16A:
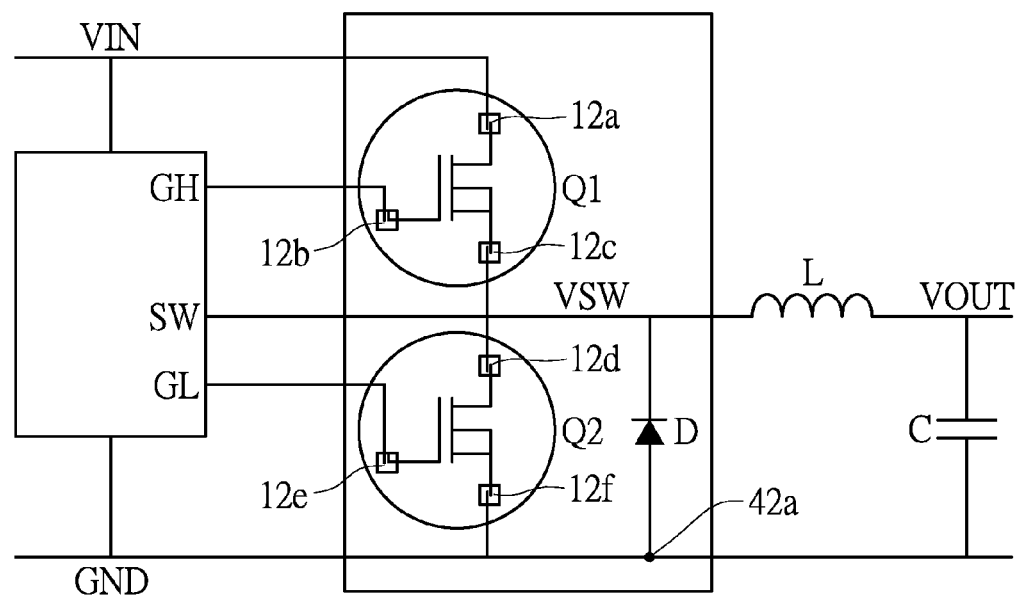
FIG. 16A shows a schematic diagram of the package structure implemented in a circuit in accordance with another embodiment of the instant disclosure.
Figure 16B:
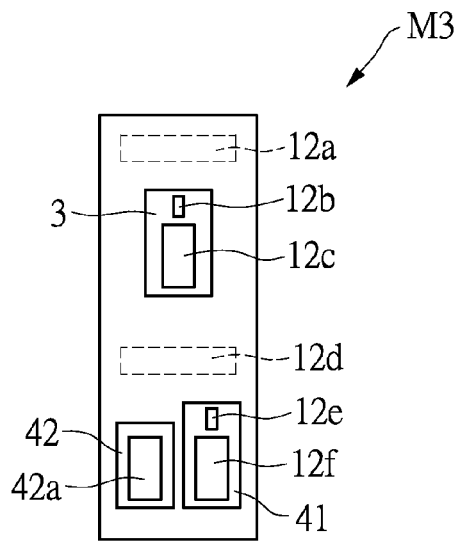
FIG. 16B shows a top view of the package structure in accordance with another embodiment of the instant disclosure.

Specifically, please refer to FIGS. 16A and 16B. FIG. 16A shows a schematic diagram of the package structure implemented in a circuit in accordance with another embodiment of the instant disclosure, and FIG. 16B shows a top view of the package structure in accordance with another embodiment of the instant disclosure. In the voltage convertor circuit shown in FIG. 16A, in addition to the high-side power MOSFET and the low-side power MOSFET which are implemented, the low-side power MOSFET is connected to a diode device in parallel.

The package structure M3 shown in FIG. 16B includes the first chip 3, the second chip 41 and the third chip 42. The first chip 3 is packaged in the first accommodating region 620a, and the second chip 41 and the third chip 42 are packaged in the second accommodating region 620b. In the instant embodiment, both of the first and second chips 3 and 41 are power transistors, and the third chip 42 is a diode device. In addition, the first chip 3, the second chip 41 and the third chip 42 can be electrically connected to each other according to the circuit diagram shown in FIG. 16A by the conductive frame and the wiring layer. In the instant embodiment, the package structure M3 can be formed by the same cutting process as the previous embodiment.

Figure 17A:
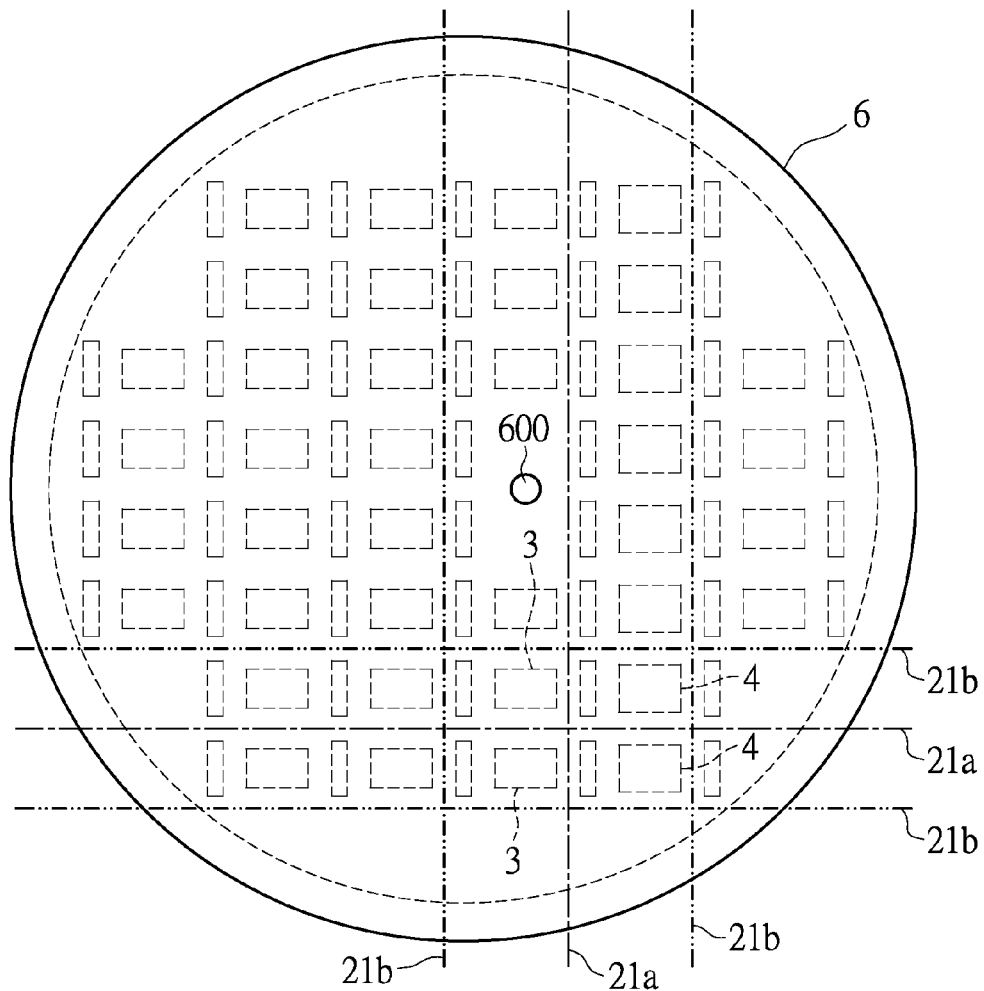
FIG. 17A shows a top view of the package structure in a step of manufacturing method in FIG. 1 in accordance with another embodiment of the instant disclosure.
Figure 17B:
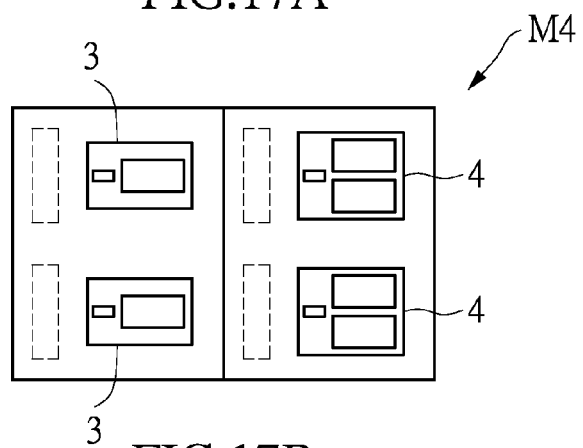
FIG. 17B shows a top view of the package structure in accordance with another embodiment of the instant disclosure.

In another embodiment, another kind of package structure can be formed by changing the cutting positions and the cutting depths. Please refer to FIGS. 17A and 17B. FIG. 17A shows a top view of the package structure during a cutting process in accordance with another embodiment of the instant disclosure, and FIG. 17B shows a top view of the package structure in accordance with another embodiment of the instant disclosure.

In the embodiment shown in FIG. 12A, the shallow cutting step is performed only in Y-direction along the first cutting lines 20a. However, in the embodiment shown in FIG. 17A, the shallow cutting step is performed not only in Y-direction but also in X-direction along the first cutting lines 21a. In addition, the cutting through step is performed in both X-direction and Y-direction along the second cutting lines 21b to form a plurality of package structures M4. Please refer to FIG. 17B. The package structure M4 includes two immediately adjacent first chips 3 which are respectively arranged in different accommodating regions and two immediately adjacent second chips 4 which are respectively arranged in different accommodating regions.

Figure 18A:
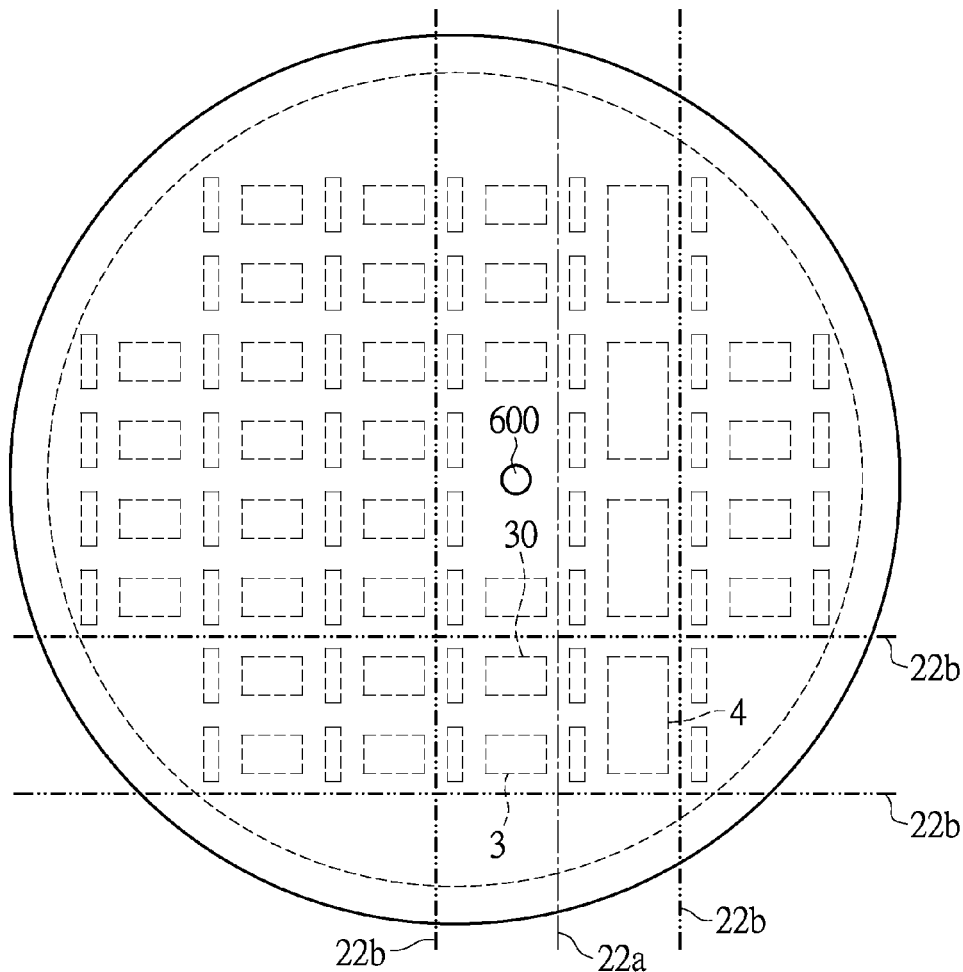
FIG. 18A shows a top view of the package structure in a step of manufacturing method in FIG. 1 in accordance with another embodiment of the instant disclosure.
Figure 18B:
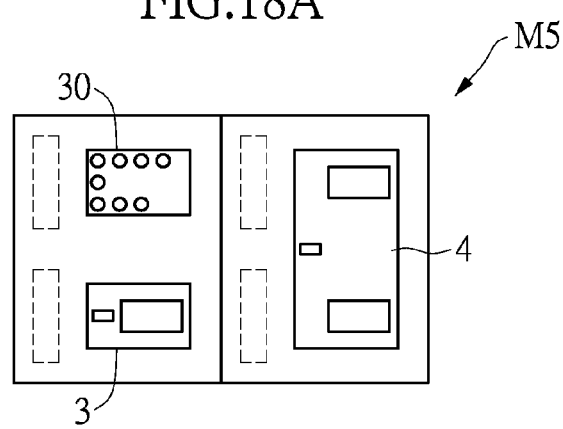
FIG. 18B shows a top view of the package structure in accordance with another embodiment of the instant disclosure.

In another embodiment of the instant disclosure, a control chip, the high-side power MOSFET, and the low-side power MOSFET, which are used in the voltage convertor circuit, can be packaged in the same package structure. Please refer to FIGS. 18A and 18B. FIG. 18A shows a top view of the package structure during the cutting process in accordance with another embodiment of the instant disclosure, and FIG. 18B shows a top view of the package structure in accordance with another embodiment of the instant disclosure.

The package structure M5 includes the control chip 30, the first chip 3, and the second chip 4. The control chip 30 can be electrically connected to the control terminals of the first chip 3 and the second chip 4 through the conductive frame and the wiring layer. In the instant embodiment, the control chip 30 and the first chip 3 are arranged immediately adjacent to each other in Y-direction, but respectively in different accommodating regions. The second chip 4 is arranged in another corresponding accommodating region, which has a size twice larger than that of the accommodating region for arranging the first chip 3.

As shown in FIG. 18A, the shallow cutting step is performed only in Y-direction along the first cutting line 22a during the cutting process to electrically isolate the drain of the first chip 3 from the drain of the second chip 4. In addition, the cutting through step is performed in both X-direction and Y-direction along the second cutting lines 22b to form a plurality of package structures M5.

[The Effectiveness of the Embodiments]

In summary, the manufacturing methods of a fan-out wafer level chip package structure are provided in the abovementioned embodiments. In the manufacturing method, the conductive cover is used to cover the chips, subsequently, the molding compound is injected into the spaces formed between the chips and the conductive cover, and then cured to form an encapsulation. As such, the size of the encapsulation can be controlled to scale down. In addition, the encapsulation does not need to be grinded. Furthermore, when the cutting process is performed on the encapsulation, different package structures can be formed by changing the cutting positions and cutting depth.

Furthermore, the package structure provided by the embodiments of the instant disclosure has the pads formed on the electrodes, and the package structure can be directly connected to the printed circuit board through the pads, which can reduce the parasitic resistance and parasitic inductance. The operating efficiency of the electronic device can be improved by using the package structure of the instant disclosure. In addition, the package structure of the instant disclosure including a conductive frame can provide high thermal dissipation efficiency.

The descriptions illustrated supra set forth simply the preferred embodiments of the instant disclosure; however, the characteristics of the instant disclosure are by no means restricted thereto. All changes, alterations, or modifications conveniently considered by those skilled in the art are deemed to be encompassed within the scope of the instant disclosure delineated by the following claims.

What is claimed is:

1. A manufacturing method of a fan-out wafer level chip package structure comprising:
   providing a supporting plate having a supporting surface and a removable tape formed on the supporting surface;
   disposing a plurality of chips on the removable tape, wherein each of the chips has an active surface and a back surface, and each of the chips is attached to the removable tape with the active surface;
   applying an adhesive layer on the back surface of each of the chips;
   providing a conductive cover having a bottom plate and a plurality of partition plates arranged on the bottom plate, wherein the partition plates define a plurality of accommodating regions;
   attaching the conductive cover to the supporting surface to cover the chips, wherein the chips are respectively arranged in the accommodating regions and isolated from each other by the partition plates, and each of the chips is adhered to the conductive cover by the adhesive layer on the back surface of each of the chips;

after the step of attaching the conductive cover to the supporting surface to cover the chips, injecting a molding compound into an inside of the conductive cover to fill a space formed between the chips and the partition plates, wherein the conductive cover serves as an encapsulation mold during the step of injecting a molding compound into the inside of the conductive cover;

performing a curing process to form an encapsulation;

separating the encapsulation from the supporting plate, wherein the active surfaces of the chips are located at a first surface of the encapsulation;

forming an connection layer on the first surface of the encapsulation to connect the chips; and performing a cutting process to divide the encapsulation into a plurality of package structures, wherein each of the package structures includes a conductive frame formed by cutting the conductive cover and a wiring layer formed by cutting the connection layer.

2. The manufacturing method of the fan-out wafer level chip package according to claim 1, wherein a first package structure of the package structure includes a first chip, a second chip, a first conductive frame, and a first wiring layer, and the first conductive frame includes a first partition plate located between the first chip and the second chip, and the first chip and the second chip are electrically connected to each other through the first conductive frame and the first wiring layer.

3. The manufacturing method of the fan-out wafer level chip package according to claim 2, wherein the first chip is a first power transistor, and the second chip is a second power transistor, and the first wiring layer includes:

a high-side gate pad, electrically connected to a gate of the first power transistor;

a low-side gate pad, electrically connected to a gate of the second power transistor;

a switch contact pad, electrically connected to a source of the first power transistor and a drain of the second power transistor through the first conductive frame; and at least one ground pad.

4. The manufacturing method of the fan-out wafer level chip package according to claim 1, wherein the conductive cover includes a rim enclosing the chips, and a height of the rim and a height of each of the partition plates are greater than a thickness of each of the chips, and during the step of attaching the conductive cover to the supporting surface, each of ending surfaces of the rim and the partition plates is adhered to the removable tape.

5. The manufacturing method of the fan-out wafer level chip package according to claim 1, wherein a back of the conductive cover has a plurality of cutting grooves to define a boundary of each of the package structures.

6. The manufacturing method of the fan-out wafer level chip package according to claim 1, wherein the conductive cover has a plurality of cutting marks, and the cutting process comprises:

cutting only the bottom plate of the conductive cover apart according to the cutting marks, leaving the molding compound intact, to form at least two conductive portions insulated from each other.

7. The manufacturing method of the fan-out wafer level chip package according to claim 2, wherein the first package structure further includes a third chip, and the first chip and the second chip are active devices, and the third chip is a passive device, and the first chip, the second chip, and the third chip are electrically connected to each other through the first conductive frame and the first wiring layer.

8. The manufacturing method of the fan-out wafer level chip package according to claim 7, wherein the first chip and the second chip are power transistors and the third chip is a diode device.

9. The manufacturing method of the fan-out wafer level chip package according to claim 2, wherein the first package structure further includes a control chip electrically connected to a control terminal of the first chip and a control terminal of the second chip through the first conductive frame and the first wiring layer.

10. The manufacturing method of the fan-out wafer level chip package according to claim 9, wherein the adhesive layer for adhering the back surface of the control chip to the first conductive frame is an insulation paste.

11. The manufacturing method of the fan-out wafer level chip package according to claim 1, wherein the conductive cover has an injection molding hole formed thereon, and before the molding compound is injected into the inside of the conductive cover through the injection molding hole, the accommodating regions are vacuumed through the injection molding hole.

* * * * *